(12) United States Patent
Cho et al.

(10) Patent No.: US 6,991,854 B2
(45) Date of Patent: Jan. 31, 2006

(54) GOLD ALLOY BONDING WIRE FOR SEMICONDUCTOR DEVICE

(75) Inventors: Jong Soo Cho, Seoul (KR); Yong Jin Park, Suwon (KR); Sung Jae Hong, Seoul (KR)

(73) Assignee: MK Electron Co., Ltd., (KR)

( * ) Notice: Subject to any disclaimer, the term of this patent is extended or adjusted under 35 U.S.C. 154(b) by 193 days.

(21) Appl. No.: 10/626,344

(22) Filed: Jul. 24, 2003

(65) Prior Publication Data

US 2004/0202568 A1 Oct. 14, 2004

(30) Foreign Application Priority Data

Apr. 14, 2003 (KR) .................. 10-2003-0023344

(51) Int. Cl.
*C22C 5/02* (2006.01)
(52) U.S. Cl. .................. 428/606; 420/507; 420/508; 257/741
(58) Field of Classification Search ............... 428/606; 420/507, 508; 257/741
See application file for complete search history.

(56) References Cited

U.S. PATENT DOCUMENTS

| | | | | |
|---|---|---|---|---|
| 4,938,923 A | * | 7/1990 | Kujiraoka et al. | 420/509 |
| 5,658,664 A | * | 8/1997 | Uno et al. | 428/364 |
| 5,945,065 A | * | 8/1999 | Kikuchi et al. | 420/507 |
| 6,063,213 A | * | 5/2000 | Ogasa | 148/430 |
| 6,123,786 A | * | 9/2000 | Uchiyama et al. | 148/430 |
| 6,492,593 B2 | * | 12/2002 | Murai et al. | 174/94 R |
| 6,700,199 B2 | * | 3/2004 | Moon et al. | 257/741 |

FOREIGN PATENT DOCUMENTS

| JP | 56-088328 | * | 7/1981 |
|---|---|---|---|
| JP | 56-088329 | * | 7/1981 |
| JP | 03-257129 | * | 11/1991 |
| JP | 06-145842 | * | 5/1994 |
| JP | 2000-040710 | * | 2/2000 |

\* cited by examiner

*Primary Examiner*—John J. Zimmerman
(74) *Attorney, Agent, or Firm*—Volpe and Koenig, P.C.

(57) ABSTRACT

A gold (Au) alloy bonding wire for a semiconductor device is provided. The Au alloy bonding wire is manufactured by adding at least one of polonium (Po), promethium (Pm), thulium (Tm), and boron (B) to high-purity gold of 99.999% or more in an amount of 3–30 parts per million (ppm) by weight and at least one of magnesium (Mg), sodium (Na), vanadium (V), molybdenum (Mo), and technetium (Tc) in an amount of 3–30 ppm by weight to the high-purity gold. In the Au alloy bonding wire, high-temperature reliability after ball bonding is not reduced and damage near a ball neck in forming an ultra low loop of the Au alloy bonding wire can be prevented.

9 Claims, 3 Drawing Sheets

US 6,991,854 B2

GOLD ALLOY BONDING WIRE FOR SEMICONDUCTOR DEVICE

BACKGROUND OF THE INVENTION

This application claims the priority of Korean Patent Application. No. 2003-23344, filed on Apr. 14, 2003, in the Korean Intellectual Property Office, the disclosure of which is incorporated herein in its entirety by reference.

1. Field of the Invention

The present invention relates to a gold alloy bonding wire for electrically connecting a semiconductor chip with a leadframe or a printed circuit board (PCB) in a packaging process of a semiconductor device, and more particularly, to a gold alloy bonding wire that can be suitably used in packaging of a highly-integrated semiconductor device.

2. Description of the Related Art

As the integration density of semiconductor devices has increased and the semiconductor devices has become thinner and smaller, a distance between interconnections of a chip of an integrated circuit (IC) has become narrower. Further, current semiconductor applications require an increase in the number of pins of bonding pads and a decrease in a distance between the pins. In order to meet this requirement and enhance the reliability of a wire bonding process, an improvement in a shape of a loop of a gold alloy bonding wire, an increase in a tensile strength of the gold alloy bonding wire, an increase in resistance vibration, an increase in a bond pull strength between the gold alloy bonding wires and bonding pads after the bonding process, an increase in a ball shear strength between the gold alloy bonding wires and a leadframe, and a prevention of a chip crack, etc. are required.

In addition, as semiconductor technologies are rapidly developing, packaging technologies for ultra highly-integrated chips and multichips have been investigated and line widths of semiconductor devices and distances between bonding pads have become excessively small. Thus, ultra fining of the gold alloy bonding wire to be used in a packaging process has been required.

However, this requirement poses the following problems. First, a high-temperature reliability after ball-bonding is reduced. Secondly, ball necks of the gold alloy bonding wires in forming an ultra low loop are, damaged.

Referring to FIG. 1, a general semiconductor package includes a semiconductor chip 10 on a pad 50, a plurality of bonding pads 20, a plurality of lead frames 40, and gold (Au) alloy bonding wires 30. The plurality of bonding pads 20 are formed on the semiconductor chip 10 as input/output ports for a variety of signals. The plurality of lead frames 40 are electrically connected to the semiconductor chip 10 to receive and output the variety of signals from and to an external circuit. The Au alloy bonding wires 30 electrically connects the bonding pads 20 and the leadframes 40. The structure of the semiconductor package is encapsulated and protected by a resin, for example, epoxy molding compound.

One end of the Au alloy bonding wire 30 attached to the bonding pad 20 includes a compressed ball 32 and a neck 34 as a connector between the compressed ball 32 and the Au alloy bonding wire 30., In a wire bonding process, one end of the Au alloy bonding wire 30 is melted by discharging to form a free air ball having a predetermined size and is further pressed on the bonding pad 20 to be attached-thereto. A loop of the Au alloy bonding wire 30 having an appropriate height and length is formed to reach a corresponding leadframe 40, and the other end of the Au alloy bonding wire 30 is attached to the leadframe 40 with an application of pressure. As a result, the semiconductor chip 10 and the leadframe 40 are electrically connected.

However, when performing the bonding process using the conventional Au alloy bonding wires 30, a damage 35, such as a crack or damage, occurs frequently in the neck 34 when forming the loop of the Au alloy bonding wire 30. Particularly, as the integration density of semiconductor devices increases, the height of the loop becomes lower and the frequency of appearance of the damage 35 near the neck 34 increases. As a result, a signal transmission path through the loop is opened.

SUMMARY OF THE INVENTION

The present invention provides a gold (Au) alloy bonding wire for securing a high-temperature bonding reliability-and preventing a damage from appearing near a ball neck after ball bonding.

According to an aspect of the present invention, there is provided a gold (Au) alloy bonding wire for a semiconductor device in which at least one of polonium (PO), promethium (Pm), thulium (Tm), and boron (B) is added to high-purity gold of 99.999% or more in an amount of 3–30 parts per million (ppm) by weight and at least of magnesium (Mg), sodium (Na), vanadium (V), molybdenum (Mo), and technetium (Tc) is added in an amount of 3–30 ppm by weight to the high-purity gold.

It is preferable that palladium (Pd) is further added to the high-purity gold in an amount of 100–1,000 ppm by weight. In addition, it is preferable that calcium (Ca) is further added to the high-purity gold in an amount of 30–80 ppm by weight. It is preferable that lanthanum (La) is further added to the high-purity gold in an amount of 20–80 ppm by weight. At this time, a diameter of the Au alloy bonding wire can be 10–50 μm.

In the specification, ppm by weight indicates ppm by weight with respect to the total weight of the Au alloy bonding wire.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

A gold (Au) alloy bonding wire according to the present invention uses high-purity Au as a main material. A high-purity gold of 99.999% or more is used for the Au alloy bonding wire according to the present invention. Gold has small electrical resistance and is the best conductive material for signal transmission in an electronic circuit. Also, gold is highly ductile and malleable so that gold can be easily extended. However, gold is greatly affected by peripheral temperature variations and tends to expand at a high temperature. In addition, because the mechanical strength of gold is weak, when a gold alloy bonding wire manufactured using gold is used for interconnections of a semiconductor package, a loop, in which the interconnections are formed, may sag or sweep. Accordingly, in order to provide a gold alloy bonding wire with excellent characteristics while keeping the excellent conductivity of gold, gold is alloyed or doped with other elements in parts per million (ppm) by weight. When the purity of gold as a main material is less than 99.999%, an amount of an element added is limited, and there is no effect in adding the element due to the presence of impurities of gold., High-purity gold of 99.999% or more can be obtained through two steps of purification, electrochemical purification and partial melting purification, so as to remove impurities and increase the purity of gold.

The Au alloy bonding wire according to the present invention can be manufactured by adding at least one of polonium (Po), promethium (Pm), thulium (Tm) and boron (B) to high-purity gold in a predetermined amount and at least one of magnesium (Mg), sodium (Na), vanadium (V), molybdenum (Mo), and technetium (Tc) to high-purity gold in a predetermined amount.

When at least one of Po, Pm, Tm, and B is added in an amount of 3 ppm by weight or less, an effect in improving a high-temperature reliability after ball bonding is little. Further, when at least one of Po, Pm, Tm, and B is added in an amount of 30 ppm by weight or more, a free air ball is hardened so that an attachment between, a bonding pad and the Au alloy bonding wire is reduced. Thus, it is preferable that at least one of Po, Pm, Tm, and B is added in an amount of 3–30 ppm by weight.

When at least one of Mg, Na, V, Mo, and Tc is added in an amount of 3 ppm by weight or less, the, ball neck is broken or damaged. Further, when at least one of Mg, Na, V, Mo, and Tc is in an amount of 30 ppm by weight or more, the free air ball is formed with many dimples on its surface so that the attachment and the high-temperature reliability are reduced. Thus, it is preferable that at least one of Mg, Na, V, Mo, and Tc is added in an amount of 3–30 ppm by weight.

In addition, palladium (Pd), calcium (Ca), and lanthanum (La), etc. may be added. When they are added to the high-purity gold together with Pm, Tm, and B, the high-temperature reliability is more improved due to a synergy effect between the elements added.

Figure 1:
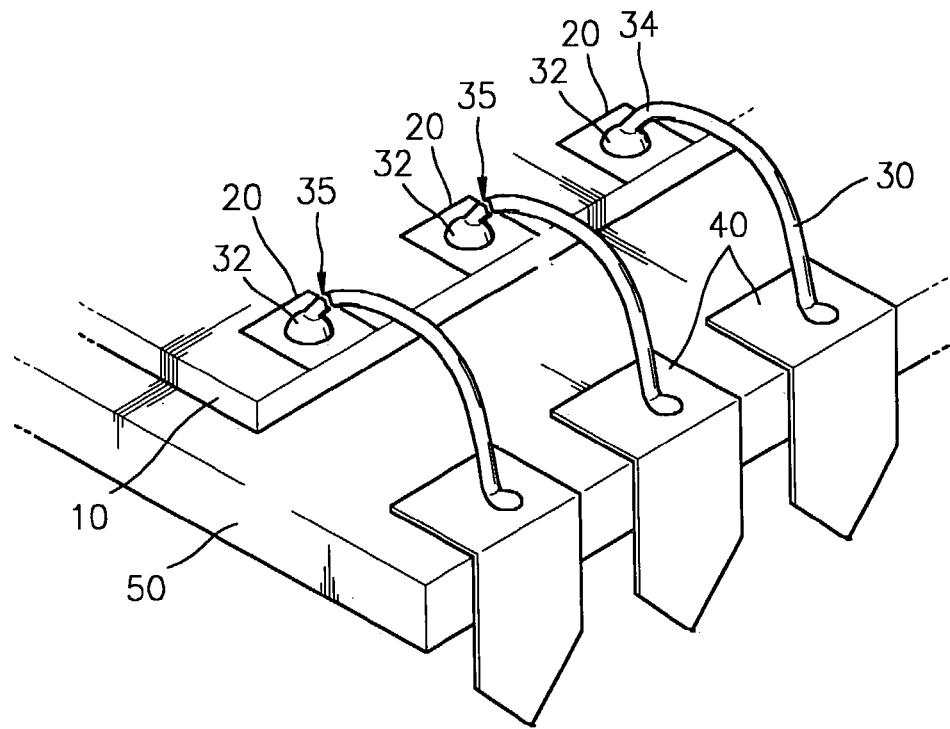
FIG. 1 shows the shape of a loop of a conventional gold alloy bonding wire.

In general, the bonding pad 20 as shown in FIG. 1 is made of aluminium (Al). Accordingly, when the Au alloy bonding wire is attached to the bonding pad 20, Au of the Au alloy bonding wire diffuses into the bonding pad 20, thereby resulting in a formation of a void near the neck. Pd forms a barrier layer for preventing diffusion of Au atom in an interface between a Au-rich region (Au alloy bonding wire region) and an Al-rich region (bonding pad region) after wire bonding. Thus, since the diffusion of Au atoms is prevented, a formation of intermetallic compound and Kirkendall void formation are suppressed. As a result, a reduction in thermal reliability is prevented.

Pd has good oxidation resistance, and thus enhances the tensile strength of the gold at room temperature and durability at high temperature when subjected to multiple thermal processes performed in the assembly of a semiconductor device. In addition, attachment reliability in a ball bonding process is increased.

According to the results of a variety of experiments, when Pd is added in an amount of 100 ppm by weight or less, an effect in improving the high-temperature reliability after ball bonding is small. When Pd is added in an amount of 1,000 ppm by weight or more, an electric property (for example, electric resistance) is reduced. Thus, an appropriate amount of Pd is in a range of 100–1,000 ppm by weight.

Ca enhances tensile strength at room temperature and high temperature and suppresses bending or deformation of a loop of the Au alloy bonding wire, such as sagging or sweeping, after forming the loop. When an ultra low loop is formed, Ca increases yield strength near the ball neck, and thus reduce or remove the damage near the ball neck. Especially, even if the Au alloy bonding wire has a small diameter, a brittle failure near the ball neck can be suppressed.

When Ca is added in an amount of 30 ppm by weight or less, an effect in improving the high-temperature reliability after ball bonding is little. Further, when Ca is added in an amount of 80 ppm by weight or more, the free air ball may be formed with many dimples on its surface. Thus, an appropriate amount of Ca is in a range of 30–80 ppm by weight.

Similar to Ca, when La is added in an amount of 20 ppm by weight or less, an effect in improving the high-temperature reliability is small. Further, when La is added in an amount of 80 ppm by weight or more, the free air ball may be formed with many dimples on its surface so that the attachment and the high-temperature reliability are reduced. Thus, an appropriate amount of La is in a range of 20–80 ppm by weight.

Figure 2:
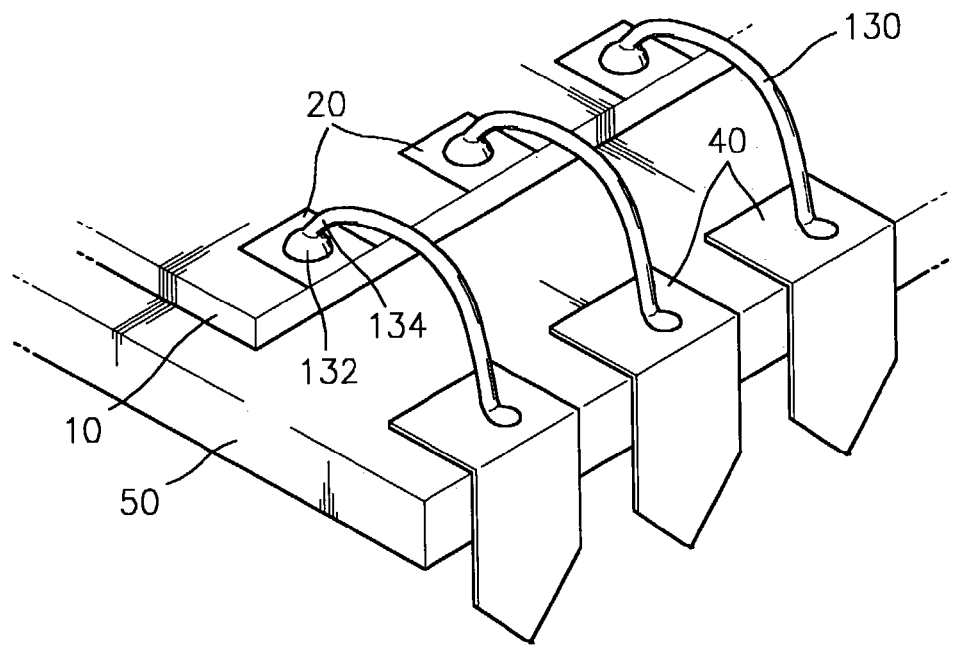
FIG. 2 shows the shape of a loop of a gold alloy bonding wire according to the present invention.

FIG. 2 shows a wire bonding process using Au alloy bonding wires 130 according to the present invention. The Au alloy, bonding wires 130 electrically connect a plurality of bonding pads 20 of a semiconductor chip 10 mounted on a pad 50 with a plurality of leadframes 40. The Au alloy bonding wire 130 attached to the bonding pad 20 includes a compressed ball 132 and a neck 134 as a connector between the compressed ball 132 and the Au alloy bonding wire 130. A loop of the Au alloy bonding wire 130 can be formed without any damage to the neck 134. Further, the shape of the loop is maintained without sagging or sweeping.

In the following examples, Au alloy bonding wires were formed with different added amounts of the above-listed elements. The following examples are for illustrative purposes and are not intended to limit the scope of the invention.

To gold of a 99.999% or more purity the above-listed elements were mixed in different ratios, as shown in Table 1 below, melted, and manufactured as Au rods through continuous casting. Next, the Au rods were subjected to a drawing process to reduce the cross-sectional area of the Au rods until Au alloy bonding wires having a desired diameter were obtained. The diameter of the Au alloy bonding wires was 20 μm. Next, the internal stress and curls of the wires were removed through, annealing.

TABLE 1

| | | B | Po | Pm | Tm | Na | Mg | Tc | Mo | V | Pd | Ca | La | Mn | In | Ag | Be | Cu |
|---|---|---|---|---|---|---|---|---|---|---|---|---|---|---|---|---|---|---|
| EXPERIMENTAL EXAMPLE | 1 | 10 | | | | | | | | | | | | | | | | |
| | 2 | | 3 | | 5 | 10 | 10 | | 10 | 10 | | | | | | | | |
| | 3 | 3 | | | | 10 | 10 | 10 | | | | | | | | | | |
| | 4 | | | 10 | 10 | 3 | | | 10 | 10 | | | | | | | | |
| | 5 | | 30 | 10 | 10 | 10 | 10 | 10 | 50 | 50 | | | | | | | | |
| | 6 | 3 | 10 | 7 | 10 | 10 | 10 | 10 | | | | | | | | | | |
| | 7 | | 50 | 50 | 50 | | | | 10 | 10 | | | | | | | | |
| | 8 | | 80 | 50 | 50 | 10 | 10 | 10 | | | | | | | | | | |
| | 9 | 3 | 50 | 30 | 50 | 50 | 50 | 50 | 10 | 10 | | | | | | | | |
| | 10 | 10 | | 10 | 10 | | 10 | 10 | | 10 | 100 | | 20 | | | | | |
| | 11 | 15 | 3 | 10 | 50 | 10 | 3 | | 10 | 50 | | 30 | 100 | | | | | |
| | 12 | 10 | | 10 | 50 | 20 | | 10 | | | 100 | 80 | | | | | | |
| | 13 | 10 | 3 | 5 | | | 10 | 3 | 10 | 10 | | 100 | 10 | | | | | |
| | 14 | 5 | 10 | 3 | | | 10 | 3 | 50 | | 100 | 10 | 20 | | | | | |
| | 15 | 10 | 10 | 10 | | | 30 | 10 | | 10 | 500 | 30 | 80 | | | | | |
| | 16 | 10 | 3 | | 10 | | 5 | 10 | 10 | | 100 | 30 | 100 | | | | | |
| | 17 | 5 | 10 | 3 | 10 | 10 | 5 | | | 10 | 1000 | 80 | | | | | | |
| | 18 | 10 | 10 | | 10 | 10 | | 10 | | 10 | | 10 | 20 | | | | | |
| | 19 | 30 | | 50 | 10 | | 3 | 10 | | 30 | 50 | | 80 | | | | | |
| | 20 | 3 | | | 10 | 10 | | 50 | 10 | | 1000 | 30 | | | | | | |
| | 21 | 100 | | 50 | 10 | 50 | 10 | | 50 | 10 | | 100 | 20 | | | | | |
| | 22 | 50 | 10 | | 3 | | 100 | 10 | 10 | 50 | 5000 | 80 | 50 | | | | | |
| | 23 | 20 | 5 | | 3 | 10 | | 5 | 5 | 10 | | 10 | 80 | | | | | |
| | 24 | 10 | 10 | | 3 | 10 | 10 | | | 10 | 100 | 30 | | | | | | |
| | 25 | 30 | 3 | 10 | | | 50 | 10 | 50 | 10 | 50 | 30 | 10 | | | | | |
| | 26 | 10 | 3 | 10 | | 10 | | | | 10 | 100 | 80 | 20 | | | | | |
| | 27 | 10 | 3 | 10 | | 5 | 10 | | 10 | | 1000 | | 80 | | | | | |
| | 28 | 3 | | 3 | | 5 | 10 | 5 | | 3 | 500 | 40 | 50 | | | | | |
| | 29 | 5 | | | 10 | | 20 | | 3 | | 100 | 50 | 30 | | | | | |
| | 30 | | 5 | | 10 | | 10 | | 10 | 3 | 500 | 50 | 20 | | | | | |
| COMPARATIVE EXAMPLE | 31 | | | | | | | | | | 800 | | | 400 | | 1000 | 20 | |
| | 32 | | | | | | | | | | 800 | 20 | | 400 | 60 | | | |
| | 33 | | | | | | | | | | | 25 | 2 | | | | | 7000 |
| | 34 | | | | | | | | | | 3000 | | | | 10 | | 20 | 10000 |
| | 35 | | | | | 1 | | | | | | 5 | | | | | 20 | |

The diameter of the Au alloy bonding wires manufactured in the compositions of Table 1 can be reduced to 10–50 μm. By using the Au alloy bonding wires which are manufactured in the compositions of Table 1 to have a diameter of 20 μm, the following experimental results presented in Table 2 were obtained. As shown in Table 2, a resistance of the Au alloy bonding wire, degree of the damage near the ball neck, the shape of the free air ball, and the high-temperature reliability were evaluated.

First, the resistance of the Au alloy bonding wire was measured using a 4-probe method while minimizing, an error in a contact resistance. At this time, a length of the Au alloy bonding wire was 300 mm, and a tensile stress of 1.0 g was applied to the Au alloy bonding wire. A specific resistivity was calculated by multiplying the measured resistance by the cross-sectional area of the Au alloy bonding wire and then dividing it by the length of the Au alloy bonding wire.

The degree of the damage near the ball neck was observed and evaluated after performing the wire bonding process while forming the loop of the Au alloy bonding wire having a height of 70 μm. In Table 2, ⊚, ○, Δ, and X indicate that the degree of the prevention of the damage near the ball neck is excellent, good, moderate, and bad, respectively.

After forming the free air ball having a diameter of 40 μm using the Au alloy bonding wire, the shape of the free air ball was observed, using a scanning electron microscope (SEM). The shape of the free air ball was evaluated using four levels, excellent (⊚), good (○), moderate (Δ) and bad (X). The ball shape was observed to determine whether an oxide was deposited on the ball surface or whether the shape of the ball is distorted or whether the ball has shrinkage cavity (or dimple).

Various reliability evaluation methods can be used for the high-temperature reliability evaluation. In this embodiment, a HTST (High Temperature Storage Test) well-known to one of ordinary skill in the art was used as the high-temperature reliability evaluation method. In the HTST, the high-temperature reliability evaluation was performed for 1,000 hours at a temperature of 175° C., conditions more severe than the requirements of reliability tests conducted for 1,000 hours at a temperature of 150° C. according to U.S. military specifications.

After a predetermined period time, a bond pull test was conducted oh each of the samples. In the bond pull test, when the samples has a reference value or less, the sample is determined to be a defective sample. 50 Au alloy wires were used on each of the samples, and test data on each of the samples were calculated.

Defective rate (%)=(the number of Au alloy wires having a value of a reference value or less)/(the number of tested Au alloy wires)

TABLE 2

|  |  | Specific Resistivity ($10^{-8}$ Ωm) | Shape of Free Air Ball | Prevention of Damage Near Ball Neck | High-Temperature Reliability (175° C.) Bonding defective rate (%) | | | | | |
|---|---|---|---|---|---|---|---|---|---|---|
|  |  |  |  |  | 0 (hr) | 200 (hr) | 400 (hr) | 600 (hr) | 800 (hr) | 1000 (hr) |
| EXPERIMENTAL EXAMPLE | 1 | 2.30 | ◎ | X | 0 | 46 | 100 | 100 | 100 | 100 |
|  | 2 | 2.32 | ○ | ○ | 0 | 0 | 0 | 16 | 24 | 50 |
|  | 3 | 2.33 | X | ◎ | 0 | 0 | 0 | 0 | 4 | 10 |
|  | 4 | 2.31 | X | ◎ | 0 | 0 | 0 | 0 | 0 | 2 |
|  | 5 | 2.39 | X | ○ | 0 | 0 | 18 | 36 | 82 | 100 |
|  | 6 | 2.33 | ◎ | ◎ | 0 | 0 | 0 | 0 | 0 | 4 |
|  | 7 | 2.37 | X | ◎ | 0 | 4 | 28 | 66 | 100 | 100 |
|  | 8 | 2.38 | X | ◎ | 0 | 12 | 32 | 80 | 100 | 100 |
|  | 9 | 2.39 | X | ○ | 0 | 10 | 48 | 100 | 100 | 100 |
|  | 10 | 2.35 | X | ◎ | 0 | 0 | 0 | 0 | 0 | 2 |
|  | 11 | 2.37 | Δ | ◎ | 0 | 0 | 0 | 0 | 8 | 28 |
|  | 12 | 2.37 | Δ | ◎ | 0 | 0 | 0 | 32 | 58 | 100 |
|  | 13 | 2.34 | Δ | ◎ | 0 | 0 | 0 | 28 | 46 | 92 |
|  | 14 | 2.37 | Δ | ○ | 0 | 0 | 0 | 12 | 38 | 76 |
|  | 15 | 2.46 | ○ | ◎ | 0 | 0 | 0 | 0 | 0 | 0 |
|  | 16 | 2.38 | Δ | ◎ | 0 | 0 | 0 | 0 | 8 | 24 |
|  | 17 | 2.53 | ○ | ◎ | 0 | 0 | 0 | 0 | 0 | 0 |
|  | 18 | 2.32 | ◎ | ◎ | 0 | 0 | 0 | 0 | 0 | 2 |
|  | 19 | 2.38 | Δ | ○ | 0 | 0 | 0 | 8 | 14 | 32 |
|  | 20 | 2.52 | Δ | ○ | 0 | 0 | 0 | 4 | 20 | 52 |
|  | 21 | 2.43 | X | ○ | 0 | 0 | 36 | 78 | 100 | 100 |
|  | 22 | 2.70 | X | X | 0 | 0 | 12 | 56 | 98 | 100 |
|  | 23 | 2.34 | ◎ | ◎ | 0 | 0 | 0 | 0 | 0 | 2 |
|  | 24 | 2.36 | ◎ | ◎ | 0 | 0 | 0 | 0 | 0 | 0 |
|  | 25 | 2.37 | Δ | Δ | 0 | 0 | 0 | 0 | 18 | 48 |
|  | 26 | 2.37 | ○ | ◎ | 0 | 0 | 0 | 0 | 0 | 0 |
|  | 27 | 2.52 | ◎ | ◎ | 0 | 0 | 0 | 0 | 0 | 4 |
|  | 28 | 2.48 | ◎ | ◎ | 0 | 0 | 0 | 0 | 0 | 0 |
|  | 29 | 2.37 | ◎ | ◎ | 0 | 0 | 0 | 0 | 0 | 0 |
|  | 30 | 2.47 | ◎ | ◎ | 0 | 0 | 0 | 0 | 0 | 0 |
| COMPARATIVE EXAMPLE | 31 | 2.58 | Δ | Δ | 0 | 4 | 46 | 100 | 100 | 100 |
|  | 32 | 2.54 | Δ | Δ | 0 | 0 | 0 | 24 | 76 | 100 |
|  | 33 | 2.87 | Δ | Δ | 0 | 0 | 12 | 54 | 82 | 100 |
|  | 34 | 2.95 | Δ | X | 0 | 0 | 0 | 24 | 48 | 100 |
|  | 35 | 2.31 | ○ | X | 0 | 8 | 42 | 100 | 100 | 100 |

In Table 1, B was added to sample No. 3 in an amount of 3 ppm by weight. Referring to Table 2, in the sample No. 3, the degree of the prevention of the damage near the ball neck was good, but the shape of the free air ball was bad. In addition, in Table 1, at least one of Po, Pm, Tm, and B was added to sample Nos. 5, 7–9, 11, 12, 19, 21, 22, and 25 in an amount of 30 ppm by weight or more., Referring to Table 2, in the sample Nos. 5, 7–9, 11, 12, 19, 21, 22, and 25, the shape of the free air ball was not good and high-temperature reliability was not good. Thus, it can be seen that a preferable amount of Po, Pm, Tm, and B is in a range of 3–30 ppm by weight.

In Table 1, Mg, Na, V, Mo, and Tc were not added to sample No. 1. Referring to Table 2, in the sample No. 1, the degree of the prevention of the damage near the ball neck was bad. In addition, in Table 1, at least one of Mg, Na, V, Mo, and Tc was added to sample Nos. 2, 5, 9, 11, 13–15, 19–22, and 25 in an amount of 30 ppm by weight or more. Referring to Table 2, in: the sample Nos. 2, 5, 9, 11, 13–15, 19–22, and 25, the degree of the prevention of the damage near the ball neck was good, but the high-temperature reliability was reduced. Thus, it can be seen that a preferable amount of Mg, Na, V, Mo, and Tc is in a range of 3–30 ppm by weight.

In Table 1, Pd was not added or was added in an amount of 100 ppm by weight or less to sample Nos. 1–9, 11, 13, 18, 19, 21, 23, and 25. Referring to Table 2, in the sample Nos. 1–9, 11, 13, 18, 19, 21, 23, and 25, the high-temperature reliability was not good. However, the high-temperature reliability was good in sample Nos. 6, 18, and 23. If Pd was added in an amount of 1,000 ppm by weight or more, the electric resistance was increased. Thus, it can be seen that a preferable amount of Pd is in a range of 100–1,000 ppm by weight.

In Table 1, Ca was not added or was added in an amount of 30 ppm by weight or less to sample Nos. 1–10, 14, 18, 19, 23, and 27. Referring to Table 2, in the sample Nos. 1–10, 14, 18, 19, 23, and 27, the high-temperature reliability was not good. However, the high-temperature reliability was good in sample Nos. 6, 18, 23, and 27. In addition, Ca was added in an amount of 80 ppm by weight or more to sample Nos. 13 and 21. Referring to Table 2, in the sample Nos. 13 and 21, the high-temperature reliability was not good. Thus, it can be seen that a preferable amount of Ca is in a range of 30–80 ppm by weight.

In Table 1, La was not added or was added in an amount of 20 ppm by weight or less to sample Nos. 1–10, 13, 17, 20, 24, and 25. Referring to Table 2, in the sample Nos. 1–10, 13, 17, 20, 24, and 25, the high-temperature reliability was not good. However, the high-temperature reliability was good in sample Nos. 6, 17, and 24. In addition, Ca was added in an amount of 80 ppm by weight or more to sample Nos. 11 and 16. Referring to Table 2, in the sample Nos. 11 and 16, the shape of the free air ball was moderate, and the high-temperature reliability was not good. Thus, it can be seen: that a preferable amount of Ca is in a range of 20–80 ppm by weight.

All in all, to sample Nos. 3, 4, 6, 10, 16, 17, 18, 23, 24, and 26–30, at least one of Po, Pm, Tm, and B was added in an amount of 3–30 ppm by weight, and at least one of Mg, Na, V, Mo, and Tc was added in an amount of 3–30 ppm by weight. Referring to Table 2, in the sample Nos. 3, 4, 6, 10, 16, 17, 18, 23, 24, and 26–30, the electric resistance was small, the degree of the prevention of the damage near the ball neck was good, and the high-temperature reliability was good. Particularly, in the sample Nos. 6, 17, 24, and 26–30, the shape of the free air ball was good so that it can be seen that these samples were good over several characteristics. Thus, it can be seen that these samples can be used suitably as the Au alloy bonding wire. Pd, Ca, and La are not added to the sample No. 6, and the sample Nos. 17 and 24 had the synergy effect by Pd and Ca. Also, the sample Nos. 26 and 28–30 had the synergy effect by Pd, Ca, and La. The sample No. 27 had the synergy effect by Pd and La.

Figure 3:
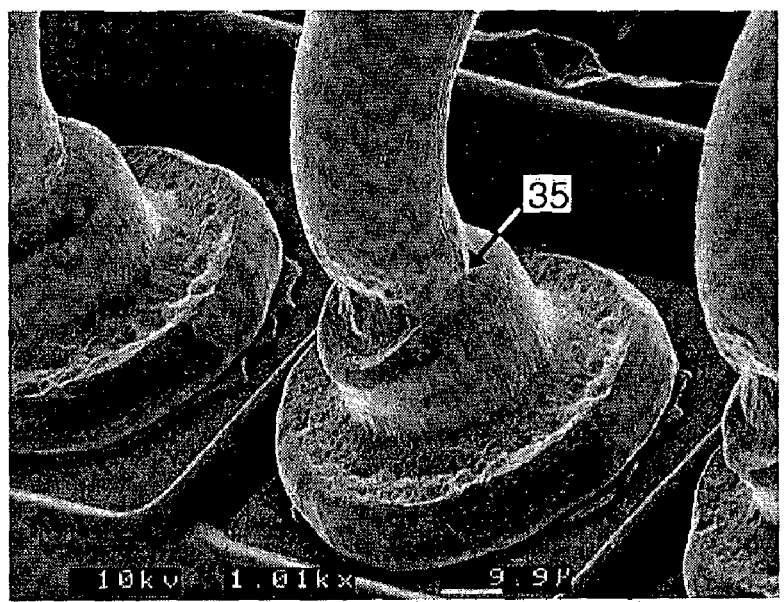
FIG. 3 is a scanning electron microscope (SEM) photograph showing a damage near a ball neck in a case of using the conventional gold alloy bonding wire.

Compared with the experimental example according to the present invention, Po, Pm, Tm, and B or Mg, Na, V, Mo, and Tc were not used in the comparative example corresponding to prior art. Instead, manganese (Mn), indium (In), silver (Ag), beryllium (Be), or copper (Cu) may be used. In sample Nos. 31–35 of the comparative example, as indicated in Table 2, the degree of the prevention of the damage near the ball neck was bad, and the high-temperature reliability was very bad. The damage near the ball neck generated in the sample Nos. 31–35 is shown as reference numeral 35 in a SEM photograph of FIG. 3.

Figure 4:
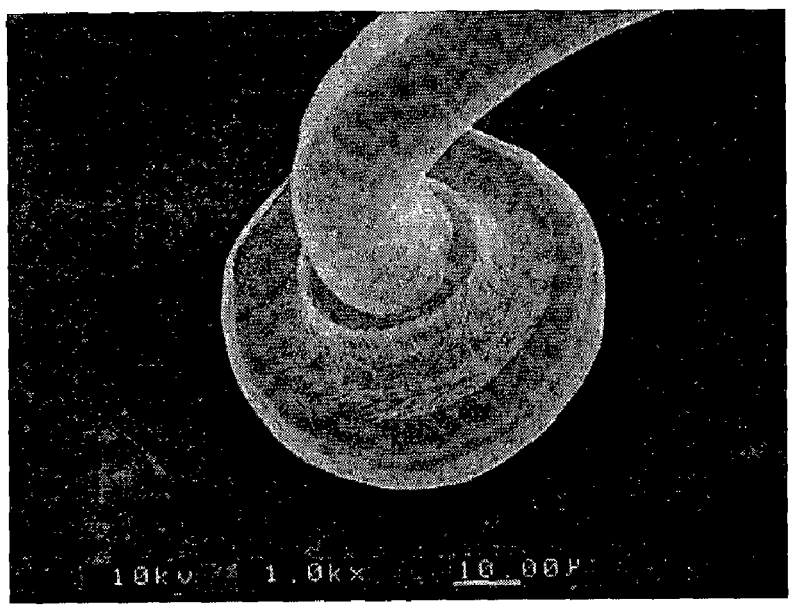
FIG. 4 is a SEM photograph showing a good ball neck in a case of using the gold alloy bonding wire according to the present invention.
Figure 5:
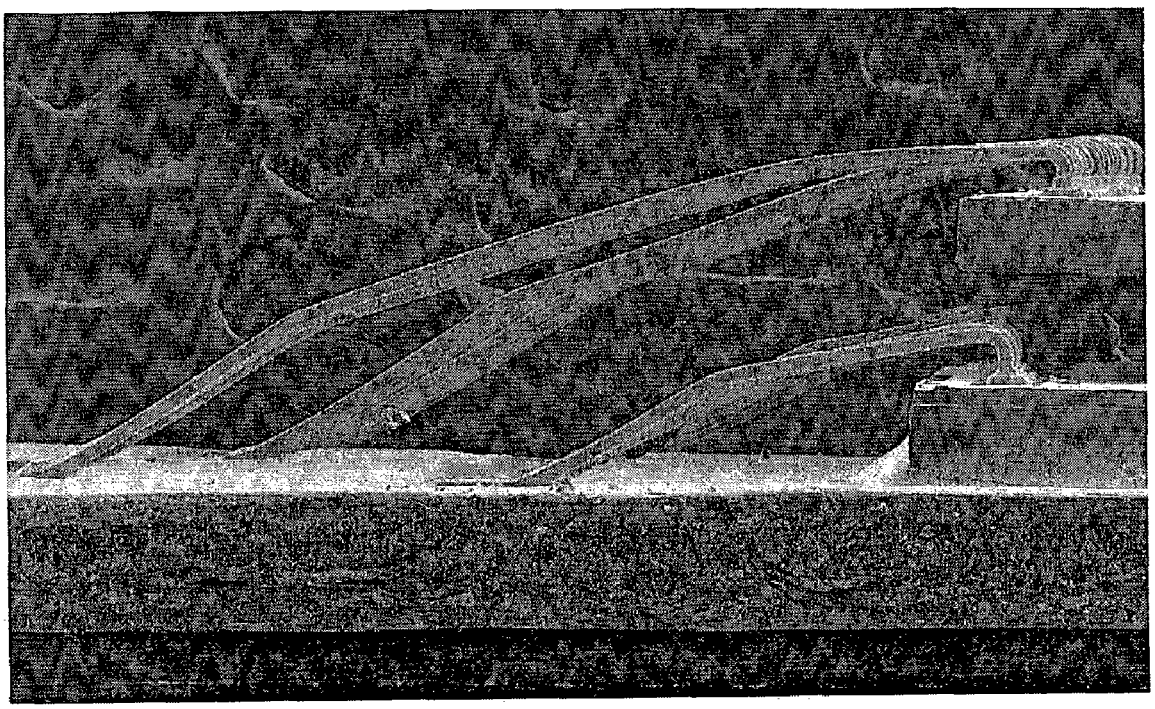
FIG. 5 is a SEM photograph showing a formation of an ultra low loop of the gold alloy bonding wire according to the present invention.

However, in a case of using the Au alloy bonding wire according to the present invention, as shown in FIG. 4, the damage near the ball neck are not found so that as shown in FIG. 5, an ultra low loop can be formed.

As described above, even when an ultra low loop of a Au alloy bonding wire according to the present invention is formed, the damage near the ball neck can be prevented. Since the Au alloy bonding wire according to the present invention has a high-temperature reliability, the Au alloy bonding wire can be widely used in forming electric interconnection in semiconductor packages for industrial applications.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A gold (Au) alloy bonding wire for a semiconductor device comprising polonium (Po) added to high-purity gold having a purity of 99.999% or greater in an amount of 3–30 parts per million (ppm) by weight and at least one of sodium (Na) and technetium (Tc) added in an amount of 3–30 ppm by weight to the high-purity gold.

2. The Au alloy bonding wire of claim 1, wherein palladium (Pd) is further added to the high-purity gold in an amount of 100–1,000 ppm by weight.

3. The Au alloy bonding wire of claim 1, wherein calcium (Ca) is further added to the high-purity gold in an amount of 30–80 ppm by weight.

4. The Au alloy bonding wire of claim 1, wherein lanthanum (La) is further added to the high-purity gold in an amount of 20–80 ppm by weight.

5. The Au alloy bonding wire of claim 2, wherein Ca is further added to the high-purity gold in an amount of 30–80 ppm by weight.

6. The Au alloy bonding wire of claim 2, wherein La is further added to the high-purity gold in an amount of 20–80 ppm by weight.

7. The Au alloy bonding wire of claim 3, wherein La is further added to the high-purity gold in an amount of 20–80 ppm by weight.

8. The Au alloy bonding wire of claim 5, wherein La is further added to the high-purity gold in an amount of 20–80 ppm by weight.

9. The Au alloy bonding wire of claim 8, wherein a diameter of the Au alloy bonding wire is 10–50 μm.

* * * * *